US005777744A

United States Patent [19]
Yoshii et al.

[11] Patent Number: 5,777,744
[45] Date of Patent: Jul. 7, 1998

[54] EXPOSURE STATE DETECTING SYSTEM AND EXPOSURE APPARATUS USING THE SAME

[75] Inventors: Minoru Yoshii, Tokyo; Masanobu Hasegawa, Utsunomiya; Kyoichi Miyazaki, Utsunomiya; Seiji Takeuchi, Utsunomiya, all of Japan

[73] Assignee: Canon Kabushiki Kaisha, Tokyo, Japan

[21] Appl. No.: 648,417

[22] Filed: May 15, 1996

[30] Foreign Application Priority Data

May 16, 1995 [JP] Japan ................................. 7-141307

[51] Int. Cl.⁶ ....................................... G01B 11/00
[52] U.S. Cl. ................................. 356/372; 356/394
[58] Field of Search ........................ 356/394, 372, 356/123

[56] References Cited

U.S. PATENT DOCUMENTS 5,124,927  6/1992  Hopewell et al. ............... 356/394
5,200,800  4/1993  Suda et al. ...................... 356/401
5,333,050  7/1994  Nose et al. ...................... 356/356
5,362,585  11/1994 Adams ............................ 430/30
5,369,486  11/1994 Matsumoto et al. ............. 356/349
5,396,335  3/1995  Hasegawa et al. .............. 356/401
5,461,474  10/1995 Yoshii et al. ................... 356/237
5,486,919  1/1996  Tsuji et al. ..................... 356/349
5,521,036  5/1996  Iwamoto et al. ................ 430/22

Primary Examiner—Richard A. Rosenberger
Attorney, Agent, or Firm—Fitzpatrick, Cella, Harper & Scinto

[57] ABSTRACT

A state-of-formation detecting system for detecting a state of formation of a periodic pattern formed, through exposure light, upon an object with a photosensitive material applied thereto, includes a light projecting device for projecting input light onto the periodic pattern, and a determining device for receiving signal light from the periodic pattern and for detecting a change in the input light, to determine the state of formation of the periodic pattern on the basis of the change in the input light.

24 Claims, 21 Drawing Sheets

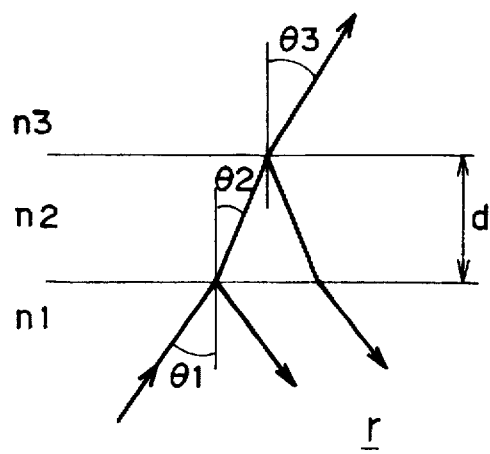
F I G. 18A
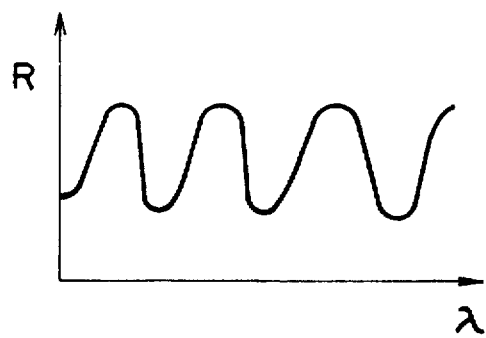
F I G. 18B
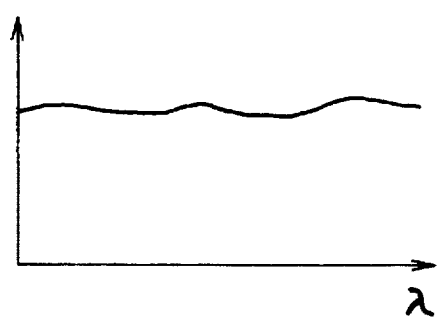
F I G. 18C

EXPOSURE STATE DETECTING SYSTEM AND EXPOSURE APPARATUS USING THE SAME

FIELD OF THE INVENTION AND RELATED ART

This invention relates generally to a projection exposure apparatus and a device manufacturing method using the same, and, more particularly, the invention is concerned with an exposure state detecting system and exposure apparatus using the same. The present invention is suitably usable in device manufacturing processes for the manufacture of microdevices such as semiconductor devices (e.g., ICs or LSIs), image pickup devices (e.g., CCDs), display devices (e.g., liquid crystal panels) and magnetic heads, and it is suitably applicable to measurement of an exposure state in a projection exposure apparatus used in a lithographic process and to real-time or prompt determination of optimum exposure conditions for the exposure process.

The degree of integration of a semiconductor device such as an IC or LSI is increasing much more, and semiconductor wafer fine processing technology is being advanced considerably. In this fine processing technology, many proposals have been made on a reduction projection exposure apparatus (stepper) by which an image of a circuit pattern of a mask (reticle) is formed upon a photosensitive substrate (wafer) through a projection optical system (projection lens system) and by which the photosensitive substrate is exposed in a step-and-repeat process.

In such steppers, a circuit pattern of a reticle is projected, in a reduced scale, upon a wafer through a projection optical system having a predetermined reduction magnification, whereby the circuit pattern is transferred and printed onto the wafer. After one projection printing operation is finished, a stage on which the wafer is placed is moved by a predetermined amount and the printing operation is repeated. With the repetitions of this process, exposure of the whole wafer surface is performed.

Generally, when a fine circuit pattern is to be printed by using a stepper having a projection optical system, it is important to set appropriate exposure conditions such as the amount of exposure of the wafer surface or the focus position of the wafer (the position with respect to the direction of the optical axis of the projection optical system).

For this reason, in conventional steppers, a trial printing process is performed before a start of mass-production to expose a photosensitive substrate while changing the exposure condition (i.e., at least one of focus position and exposure amount (shutter open time)) in each shot. After this, the photosensitive substrate is subjected to a development process, and the line width of straight patterns is measured by using an optical microscope or a line width measuring device. Optimum exposure conditions are determined in this manner.

As an example, as regards those shot regions of a wafer along a lateral direction of the array of the shot regions, the exposure process is performed with a constant focus value while successively changing the exposure amount (shutter time). As regards those shot regions along a longitudinal direction of the array, the exposure process is performed with a constant exposure amount while successively changing the focus value.

Then, the line width of a line-and-space (L&S) pattern in each shot region as formed after the development process, is measured by means of a scanning type electron microscope (SEM). On the basis of this measurement, the optimum focus position of the projection lens and the optimum exposure amount are calculated.

In conventional steppers, for setting the optimum exposure condition (exposure amount and focus position), the line width of a resist pattern formed on a wafer is measured by using a scanning electron microscope, for example. This requires a long processing time.

SUMMARY OF THE INVENTION

It is an object of the present invention to provide a projection exposure apparatus and/or a device manufacturing method using the same, by which optimum exposure conditions can be set in a reduced time and by which a projected pattern of high density can be provided easily.

In accordance with an aspect of the present invention, there is provided a state-of-formation detecting system for detecting a state of formation of a periodic pattern formed, through exposure light, upon an object with a photosensitive material applied thereto, said system comprising: light projecting means for projecting input light onto the periodic pattern; and determining means for receiving signal light from the periodic pattern and for detecting a change in the input light, to determine the state of formation of the periodic pattern on the basis of the change in the input light.

In a preferred form according to this aspect of the present invention, the state of formation of the periodic pattern to be detected concerns a duty of the periodic pattern.

In another preferred form of this aspect of the present invention, the change in the input light to be detected concerns a change in state of polarization of the input light.

In a further preferred form of this aspect of the present invention, the change in the input light to be detected concerns a change in intensity of the input light.

In a still further preferred form of this aspect of the present invention, the input light has a wavelength different from that of the exposure light.

In accordance with another aspect of the present invention, there is provided a projection exposure apparatus for projecting a periodic pattern of a first object, illuminated with exposure light, onto a second object having a photosensitive material applied thereto, through a projection optical system, said apparatus comprising: light projecting means for projecting input light onto a print pattern formed on the photosensitive material; and determining means for receiving signal light from the print pattern and for detecting a change in the input light, to determine the state of formation of the periodic pattern on the basis of the change in the input light.

In one preferred form of this aspect of the present invention, the state of formation of the print pattern to be detected concerns a duty of the print pattern.

In another preferred form of this aspect of the present invention, the change in the input light to be detected concerns a change in state of polarization of the input light.

In a further preferred form of this aspect of the present invention, the change in the input light to be detected concerns a change in intensity of the input light.

In a still further preferred form of this aspect of the present invention, the input light has a wavelength different from that of the exposure light.

In accordance with a further aspect of the present invention, there is provided a projection exposure method for projecting a periodic pattern of a first object, illuminated with exposure light, onto a second object having a photosensitive material applied thereto, through a projection optical system, said method comprising the steps of: projecting and printing the periodic pattern of the first object onto the photosensitive material of the second object while changing an exposure condition, to define plural print patterns; projecting input light onto each of the print patterns and receiving signal lights from the print patterns and detecting a change in the input light, to determine a state of formation of the print patterns on the basis of the change in the input light; and determining the exposure condition on the basis of the state of formation of the print patterns.

In one preferred form of this aspect of the present invention, the exposure condition concerns an amount of exposure of the second object.

In another preferred form of this aspect of the present invention, the exposure condition concerns a position of the second object with respect to a direction along an optical axis of the projection optical system.

In a further preferred form of this aspect of the present invention, the state of formation of the print pattern to be detected concerns a duty of the print pattern.

In a still further preferred form of this aspect of the present invention, the change in the input light to be detected concerns a change in state of polarization of the input light.

In a yet further preferred form of this aspect of the present invention, the change in the input light to be detected concerns a change in intensity of the input light.

In a yet further preferred form of this aspect of the present invention, the input light has a wavelength different from that of the exposure light.

In accordance with a yet further aspect of the present invention, there is provided a device manufacturing method wherein a pattern of a reticle is projected onto a wafer through a projection optical system and wherein the wafer is subsequently treated by a development process, whereby a device is produced, said method comprising the steps of: projecting a periodic pattern of the reticle onto a photosensitive material of the wafer while changing an exposure condition, to define plural print patterns on the wafer; projecting input light onto each of the print patterns and receiving signal lights from the print patterns and detecting a change in the input light, to determine a state of formation of the print patterns on the basis of the change in the input light; and determining the exposure condition on the basis of the state of formation of the print patterns.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 18A–18C are a schematic view and graphs, for explaining a basic principle of determining thickness from a spectral reflectivity, the principle being used in an embodiment of the present invention.

DESCRIPTION OF THE PREFERRED EMBODIMENTS

Figure 1:
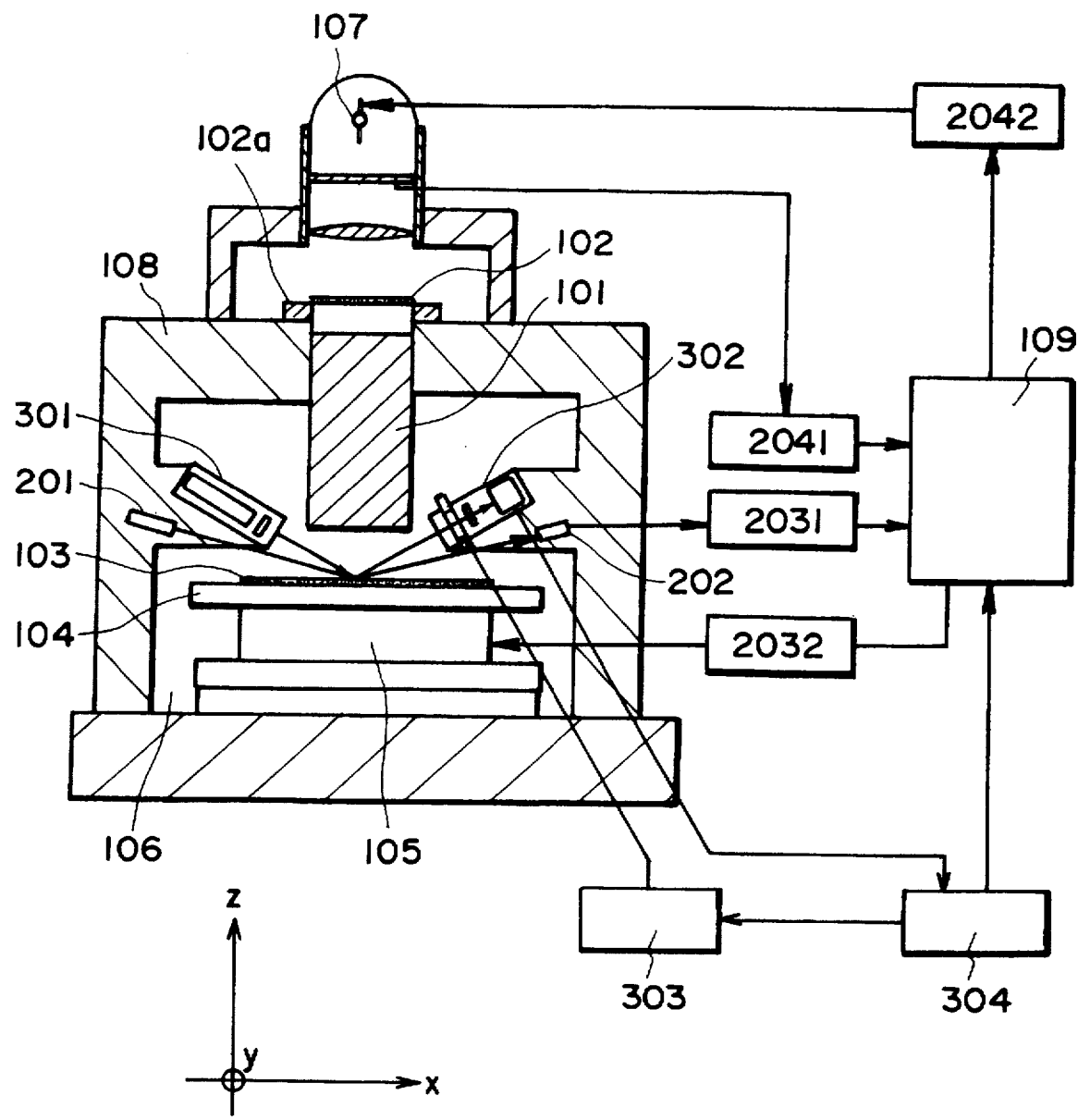
FIG. 1 is a schematic and sectional view of a main portion of a projection exposure apparatus according to a first embodiment of the present invention.
Figure 2:
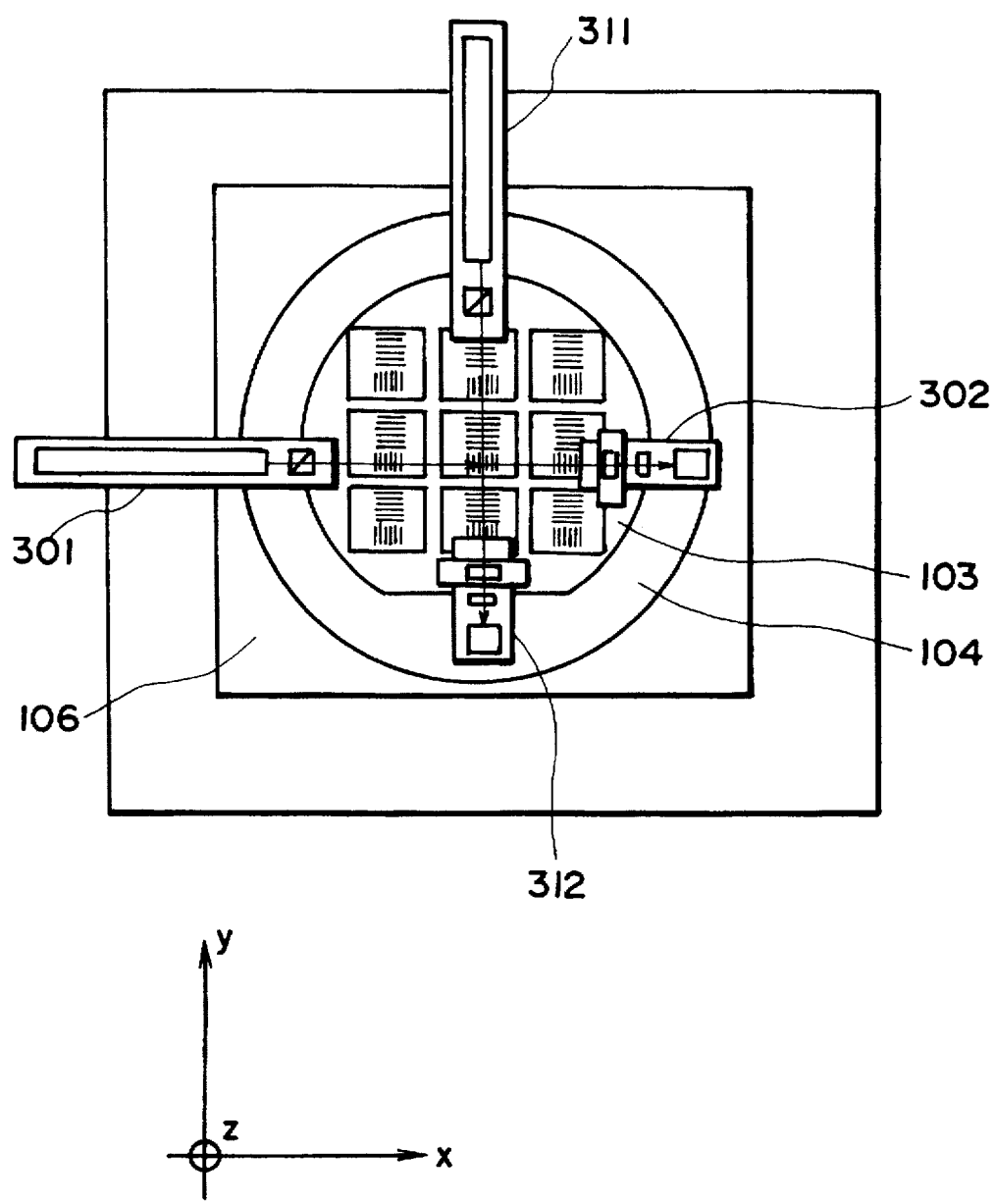
FIG. 2 is a plan view of a portion of the the apparatus of the first embodiment of the present invention.

First, features of the method of setting optimum exposure conditions in projecting and printing a pattern of a first object (reticle) on a second object (wafer), in accordance with the present invention, will be explained.

The present invention uses the principle that, when a line-and-space (L&S) pattern is transferred to a resist, under the condition of (a) optimum focus position and (b) optimum exposure amount, the duty (the sum of the width of a resist-remaining portion and the width of a resist-removed portion, that is, the ratio of the width of the resist-remaining portion to the pitch) becomes equal to 2:1.

Thus, in the present invention, a mask having formed thereon a reference pattern for exposure condition measurement as having a periodicity in one direction (for example, L&S duty of 2:1) is used as a reticle, and an image of this reference pattern is sequentially printed on a wafer (W) while changing at least one of the exposure amount and the focus position.

Then, light having a predetermined wavelength and a predetermined state of polarization is projected, with a predetermined incidence angle, onto a print pattern formed as a result of this printing operation, such as a latent image in a resist on the wafer (i.e., an image defined by a portion in which the refractivity has changed due to a chemical change of resist by the exposure) or a surface-step pattern defined by a development process.

The projected light goes through the resist material and is reflected by the substrate of the wafer, and then it goes through the resist material and emerges out of the wafer. This light is combined with light directly reflected by the surface of the resist. Then, the state of polarization of the combined light is measured.

Generally, it is known that a diffraction grating of phase type which comprises a surface-step pattern does not produce diffraction light, with a wavelength longer than its pitch, and that it has a double refraction characteristic.

While some preferred embodiments of the present invention will be described mainly in relation to a case where reflection light is detected, if the pitch of the resist pattern is larger than the wavelength, there occurs diffraction light. Similar measurement is possible with such diffraction light.

Next, the polarization analysis method usable in the present invention will be explained.

It is now assumed that the grating thickness is d and the duty ratio is t, and that laser light having a wavelength longer than the periodicity is perpendicularly projected upon a double refraction element. It is known that, in such a case, depending on whether the state of polarization of the incident light is parallel to or perpendicular to grooves of the grating, the refractivities n∥ and n⊥ of the double refraction element in the periodical structure portion are given by the following equations, wherein n∥ is the refractivity to light parallel to the groove of the grating and n⊥ is the refractivity to light perpendicular to it:

$$n\| = \sqrt{\{t \cdot n1^{}2 + (1-t) \cdot n2^{}2\}}$$

$$n\perp = 1/\sqrt{\{(t/n1^{}2) + (1-t)/n2^{}2)\}}$$

where n1 and n2 are refractivities of the L (line portion) and S (space portion) of the grating. The line portion L and the space portion S are such that, as regards the resist latent image, L corresponds to a resist and S corresponds to an exposed resist. After the resist is developed, L corresponds to a resist and S corresponds to a gas such as air, for example.

A model of polarization analysis corresponds to measuring double refraction of a double refraction medium of a predetermined thickness on a wafer substrate. The polarization analysis method is such that: linearly polarized light having a P/S phase difference (between P-polarized light and S-polarized light) of zero and an amplitude ratio of 1 is projected upon the wafer substrate with a predetermined angle θ, and a phase difference (Δ) and an amplitude ratio (φ) of reflected light are measured, and finally the refractivities n∥ and n⊥ are determined on the basis of the resist thickness d and the refractivities n1 and n2 of the line portion L and the space portion S as measured beforehand. From the values of the refractivities n∥ and n⊥ determined through the polarization analysis process, the duty t can be determined. The polarization analysis method described above is known in the art and, therefore, a detailed description thereof will be omitted here.

The present invention uses the polarization analysis method to measure the duty of a latent image pattern in a resist or a surface-step pattern formed after a development process.

An embodiment of the present invention involves a step of transferring and printing an L&S pattern repeatedly onto the surface of a photosensitive material under different exposure conditions to thereby form plural print patterns, a step of projecting light sequentially to the print patterns and detecting a state of polarization of reflected light therefrom to calculate a duty of the print pattern on the basis of the state of polarization, a step of determining an exposure condition which provides a desired duty, and a step of performing a printing operation to plural wafers under the determined exposure condition.

Now, some preferred embodiments of the present invention will be described with reference to the drawings.

FIG. 1 is a schematic view of a main portion of a projection exposure apparatus according to a first embodiment of the present invention. FIGS. 2–6 are illustrations of portions of FIG. 1, for explaining this embodiment.

In FIG. 1, denoted at 101 is a projection lens system of reduction type which serves to project a circuit pattern 102a of a reticle 102, as illuminated with exposure light from an exposure light source 107 (to be described later), onto a wafer 103. Denoted at 104 is a wafer chuck for holding the wafer 103 through attraction. Denoted at 105 is a rough-motion and fine-motion stage for roughly and finely moving the wafer chuck 104 in a Z direction. Denoted at 106 is an X-Y stage for moving the wafer chuck in X and Y directions. Denoted at 107 is the exposure light source. Denoted at 108 is a structure which serves to support the light source 107, the reticle 102, a barrel 101 and the wafer stage 106, for example.

Figure 4:
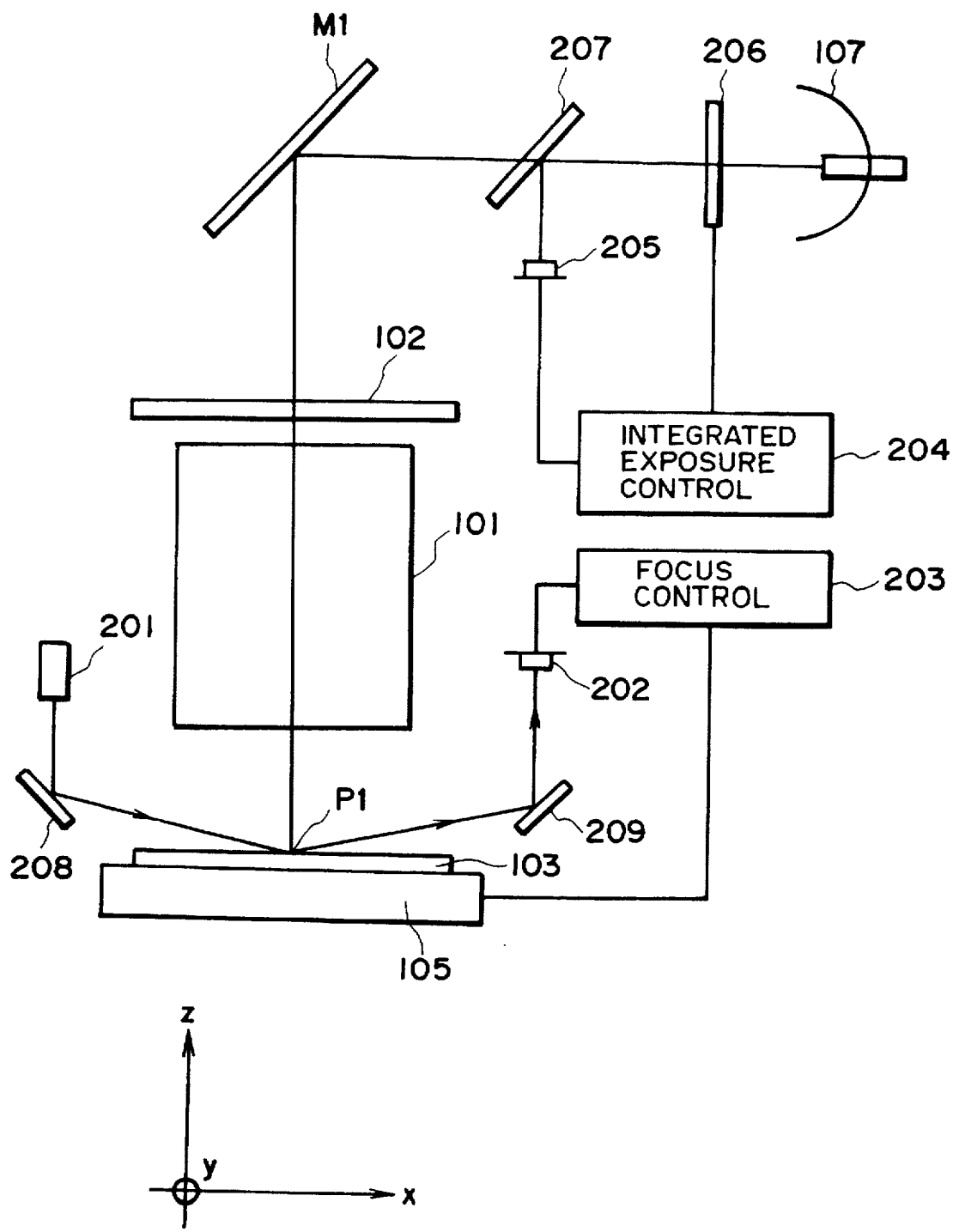
FIG. 4 is a schematic view for explaining focus detection and exposure amount control in an exposure apparatus.

Referring now to FIG. 4, a description will be made of control means which includes a focus position controlling system for detecting the position of the wafer 103 with respect to the direction of an optical axis of the projection lens system 101, that is, the focus position, as well as an exposure amount controlling system for controlling the exposure amount when the reticle 102 is to be illuminated with the exposure light.

In FIG. 4, denoted at 201 is a high-luminance light source such as a semiconductor laser, for example. Laser light produced by the light source 102 is deflected by a deflecting mirror 208, and it is projected upon the surface of the wafer 103. After being reflected at a measurement point P1 on the wafer 103, the light is deflected by a deflecting mirror 209 and is projected upon a detecting element 202 which serves to detect a two-dimensional position of incident light. The detecting element 202 comprises a CCD, for example, and it detects the position of light incident thereon. More specifically, a change in position of the wafer 103 surface in the Z direction (the optical axis direction of the projection lens system 101) is detected as a displacement of light incidence position upon the detecting element 202. On the basis of a signal from this detecting element 202, the focus controlling system denoted at 203 controls the position of the wafer 103 in the Z direction, namely, the focus position, through the Z stage 105.

Denoted at 206 is a shutter opening/closing mechanism, and denoted at 207 is a half mirror. Denoted at 206 is an illuminance sensor for detecting the exposure amount by the light from the light source 107 as reflected by the half mirror 207. Integration exposure controlling system 204 serves to control the shutter opening/closing mechanism on the basis of a signal from the illuminance sensor 205, to control the amount of passage of light from the light source 107. By this, the amount of exposure upon the reticle 102 is adjusted to a level set beforehand.

In this embodiment, the control means having the exposure amount controlling system and the focus position controlling system such as described above is used to control the exposure condition as a pattern of the reticle 102 is to be projected onto the wafer 103 surface.

Next, the process of projecting a pattern of the reticle 102 illuminated with exposure light from the light source 107, onto the wafer 103 surface, will be explained.

Figure 5:
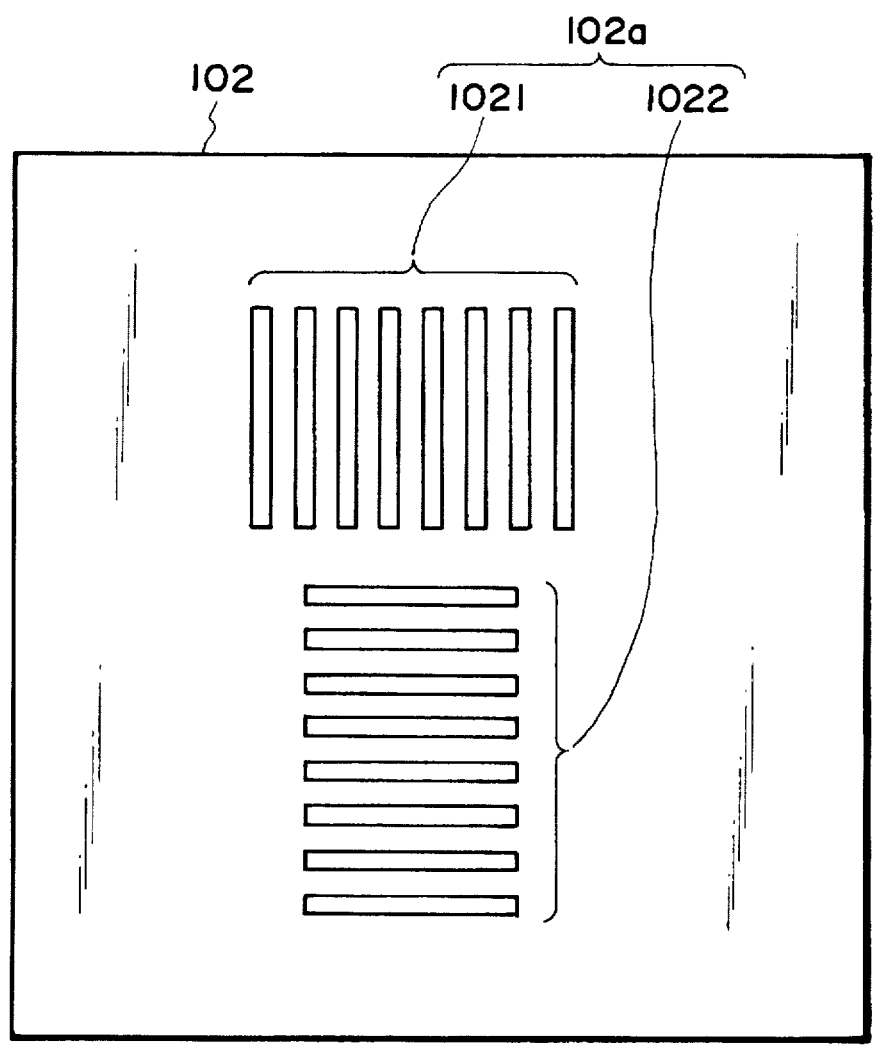
FIG. 5 is an enlarged view for explaining a reticle pattern for exposure condition measurement.

FIG. 5 is an enlarged view for explaining a reference pattern 102a formed on the reticle 102 surface. The reference pattern 102a includes line-and-space (L&S) patterns 1021 and 1022 comprising lines (L) and spaces (S), arrayed perpendicularly as illustrated.

In this embodiment, the reticle 102 having formed thereon the reference pattern 102a comprising L&S patterns 1021 and 1022, is loaded on the reticle stage 102a, and a wafer 103 coated with a resist is loaded on the wafer chuck 104. Then, the pattern 102a of the reticle 102 is printed repeatedly on the wafer 103 through a step-and-repeat process. During this step-and-repeat exposure process, the focus controlling system 203 and the integration exposure controlling system 204 are used, and a zone 1031 (corresponding to a one-shot region) is repeatedly printed every time latent images 10312 and 10311 of the patterns 1021 and 1022 are printed.

Figure 6:
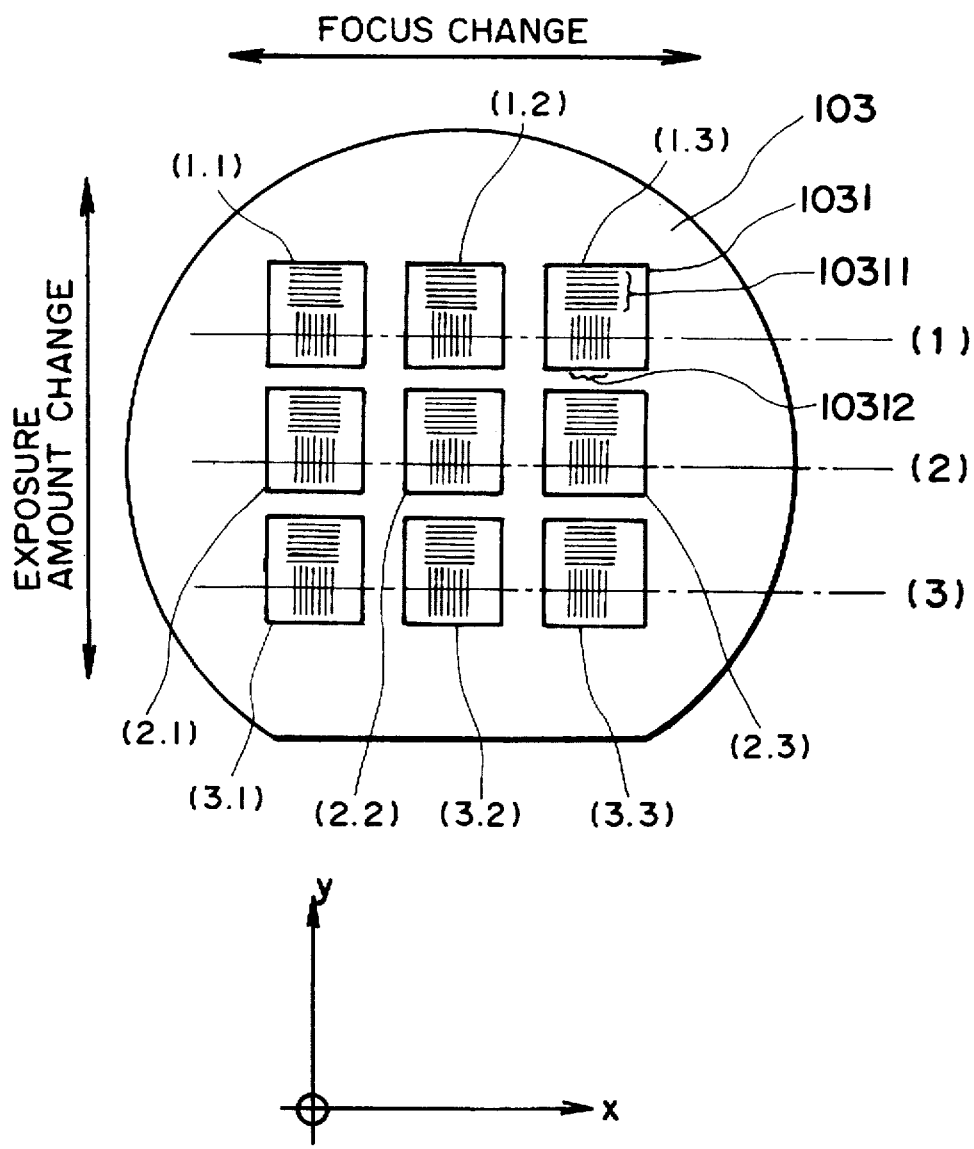
FIG. 6 is a schematic view for explaining resist latent images on a wafer, as defined with successively changed exposure conditions.

The stepwise motion is performed while changing the focus offset incrementally or decrementally around an expected optimum position in accordance with the shot position in the X direction. Similarly, as regards the shot position in the Y direction, the exposure operation is performed while changing the exposure amount successively around an optimum exposure amount (shutter open time). In the example of FIG. 6, a matrix of 3×3 is illustrated. However, this is only for the simplicity of illustration. The more the number of shots is, the easier the determination of the condition is.

Figure 7A:
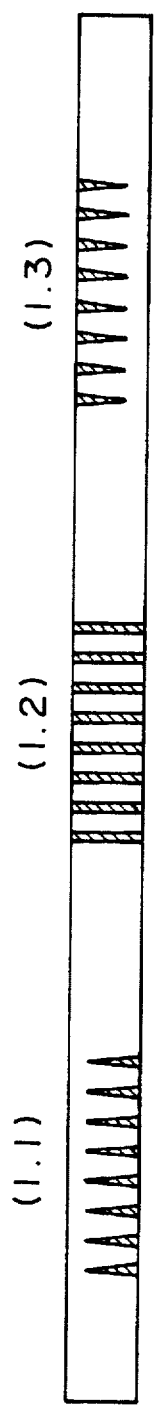
FIGS. 7A–7C are schematic views, respectively, for explaining wafer latent images of FIG. 6.
Figure 7B:
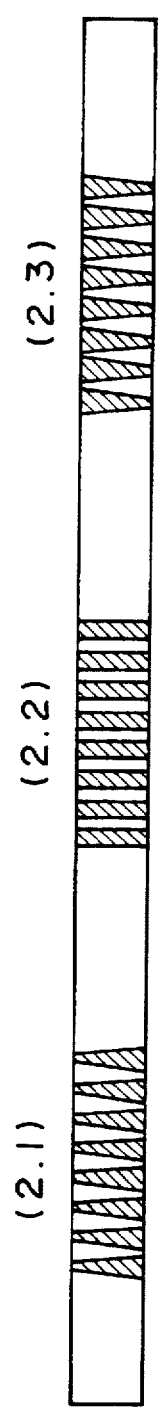
Figure 7C:
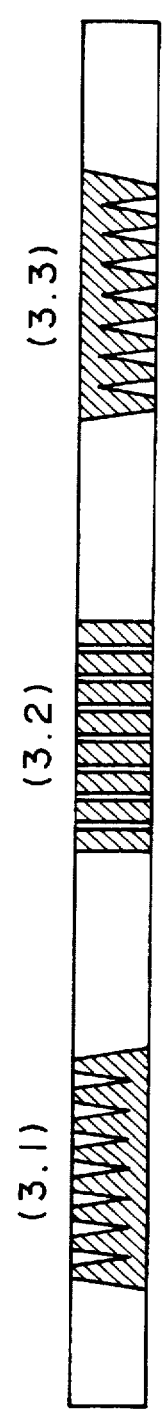

FIGS. 7A–7C are sectional views of the resist on the wafer 103, illustrating the result of sequential exposures made in the manner as described. In the resist of the wafer 103 having been exposed, latent images such as shown in FIGS. 7A–7C are formed. A latent image results from a change in property due to a chemical change, for example, of a resist caused by irradiation with exposure light. Those portions depicted with hatching are the portions having been irradiated with light. In these portions, the refractivity has been changed.

The matrix addresses in FIGS. 7A–7C correspond to sections at the addresses shown in FIG. 6, and FIGS. 7A, 7B and 7C illustrate the sections of pattern images of chips (1.1), (1.2) and (1.3), respectively.

The resist of an exposed wafer 103 having latent images such as illustrated in FIGS. 7A–7C is then analyzed by using a polarization analyzing device 300 (FIG. 1) which includes light source means 301, light receiving means 302, driver means 303 and polarization processing means 304. This analyzing device 300 serves to measure an amplitude ratio $\phi$ and a phase difference $\Delta$ of reflected light, to input light.

Figure 3:
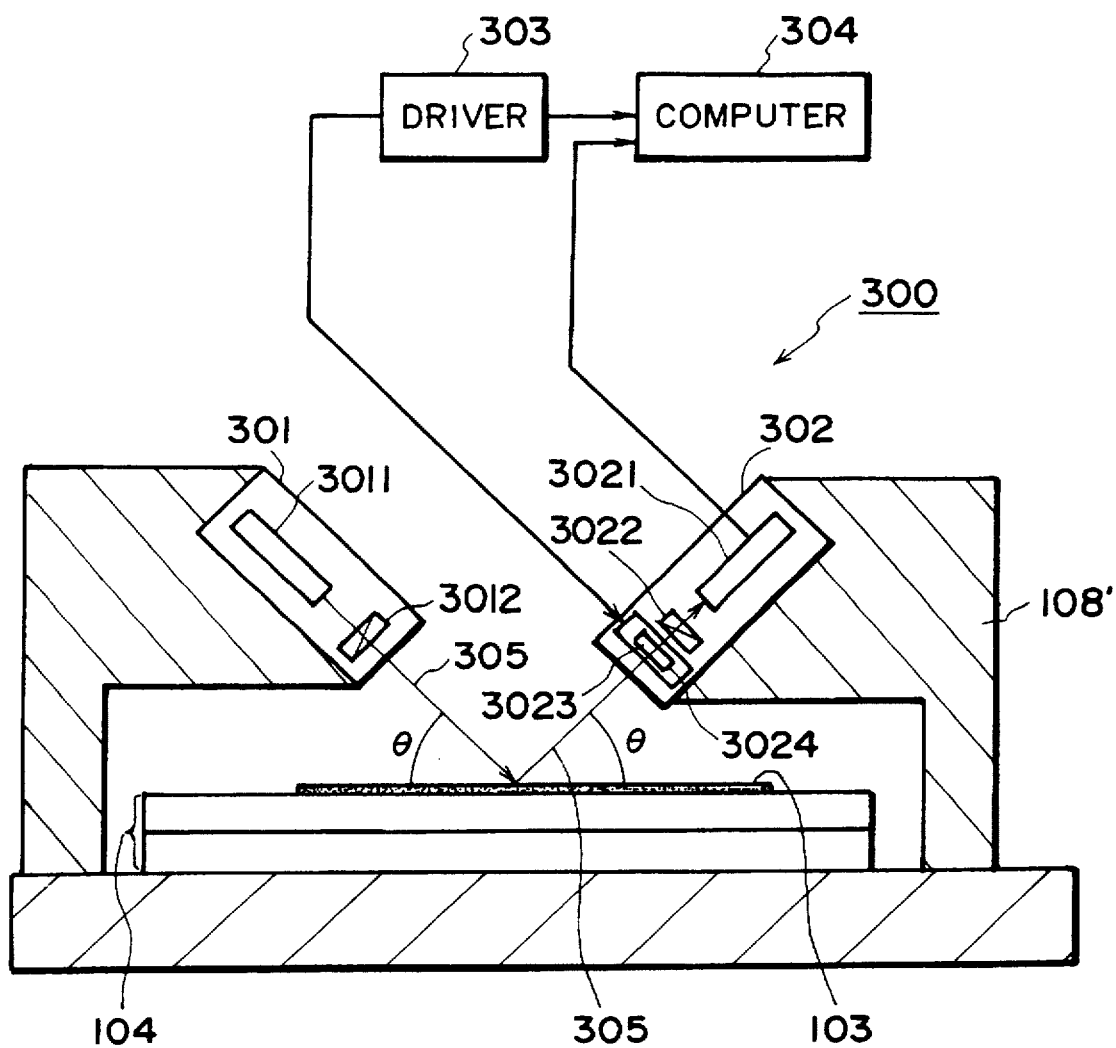
FIG. 3 is a schematic and sectional view for explaining a portion of a polarization analyzing device of the FIG. 1 embodiment.

FIG. 3 is a schematic view of a main portion of the polarization analyzing device 300 of FIG. 1. FIGS. 11A through 11D are schematic views of an extended optical path of FIG. 3. In FIGS. 3 and 11A through 11D, the light source means 301 includes a light source 3011 (it may comprise a He—Ne laser having a wavelength greater than the L&S pitch on the wafer 103 or, alternatively, it may comprise monochromatic light from a spectrometer) and a polarization element 3012 (such as a Glan-Thompson element, for example). The polarization element 3012 is set in relation to the wafer 103 so that the plane of polarization thereof is disposed with an angle of 45 degrees to the sheet of the drawing, to assure that the P-polarized component (parallel to the sheet of the drawing) and the S-polarized component (perpendicular to the sheet of the drawing) are of the same quantity. Thus, the lights P and S have a phase difference $\Delta$ of zero, and an amplitude ratio $\phi$ is 1.

The light receiving means 302 includes a quarter wave ($\lambda/4$) plate 3024 having an anistropy axis orthogonal to light 305, a polarization element or analyzer element 3022 (such as a Glan-Thompson element, for example) and a photoelectric converting element 3021. The quarter wave plate 3024 is supported by a rotation mechanism 3023 having its axis of rotation along the light 305. It is rotatable at a constant speed in response to a signal from the driver means 303.

Light 305 emitted from the light source means 301 is reflected by the surface of the resist on the wafer 103 and by the surface of the wafer. In a combined wave of reflected lights, the phase difference $\Delta$ and amplitude ratio $\phi$ of P-polarized light and S-polarized light change in accordance with the double refractivities n1 and n2 of the resist on the wafer, for example.

The polarization analyzing device 300 operates so that light is detected through the quarter wave plate 3024 and the analyzer 3022 and by a detector (photoelectric converting element) 3021, whereby an electric signal of a sine wave corresponding to the phase difference $\Delta$ and amplitude ratio $\phi$ is provided. From the the phase information of the sine wave of a magnitude of the DC component and the amplitude, the phase difference $\Delta$ and the amplitude ratio $\phi$ are determined.

The polarization analysis method is used as described above and, by giving refractivity n1 of an unexposed portion of the resist, refractivity n2 of an exposed portion of the resist, thickness d of the resist and the double refractivity ns of the substrate, having been measure beforehand, the refractivity n⊥ of the line-and-space resist pattern (double refractivity structure) is determined.

Then, from the refractivity n⊥, the duty t⊥ is determined in accordance with the following calculation:

$$t\perp = n1^{}2 \cdot (n2^{}2 - n1^{}2)/\{n^{}2 \cdot (n2^{}2 - n1^{}2)\}$$

From the value of refractivity n∥, the duty t∥ is given by:

$$t\| = (n\|^{}2 - n2^{}2)/(n1^{}2 - n2^{}2)$$

These two values are averaged as follows to enhance the precision:

$$t\perp = (t\perp + t\|)/2$$

Usually, the duty can be determined in the process described above. However, there are cases where a measured value changes due to irregularity of a resist or an underlying structure. In consideration of this, to the polarization analysis measurement in the X direction as described, a second polarization analysis system (311 and 312) such as shown in the plan view of FIG. 2 which is perpendicular to the X-direction polarization analysis measurement, that is which is in the Y direction, is added to perform measurement simultaneously to substantially the same point as of the measurement point to be measured by the first polarization analysis system (301 and 302). This enhances the precision such as follows:

In this case, similarly to the case where the duty t1 is determined, it is given that:

$$t2 = (t\perp + t\|)/2.$$

It is averaged with the duty t1 described hereinbefore:

$t2 = (t1+t2)/2$

Thus, the measurement precision of the duty t is enhanced more.

Figure 8:
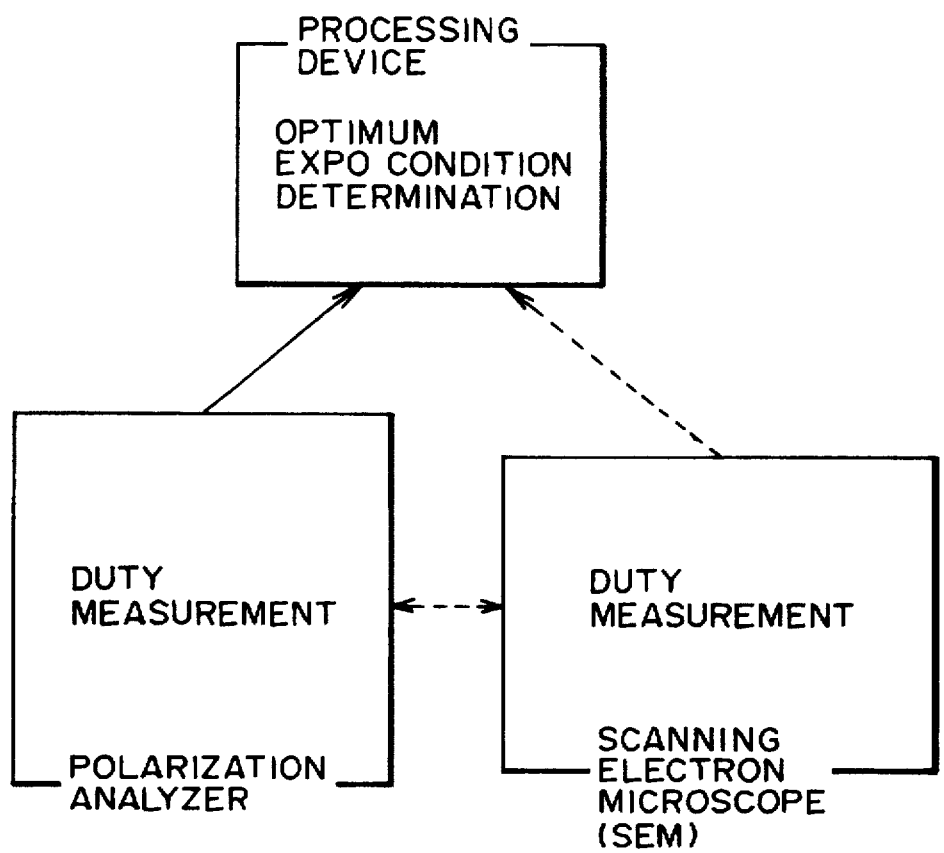
FIG. 8 is a schematic view for explaining calibration, through a scanning election microscope, of a measured value of a polarization analyzing device.

On the other hand, FIG. 8 illustrates the process of finding an optimum exposure condition on the basis of a comparison of the duty as determined by polarization analysis of the L&S sample with a value obtained by development of that sample and by measurement through a scanning electron microscope (SEM). This process functions to determine an offset of duty which might be caused in the polarization analysis process due to an underlying structure, for example. In the subsequent measurement process, the offset value is subtracted from a measured value, and the resultant value is used as a correct value. The comparison using SEM may be performed just once at the first time when a process condition, for example, is changed. It may not be necessary after that.

Figure 9:
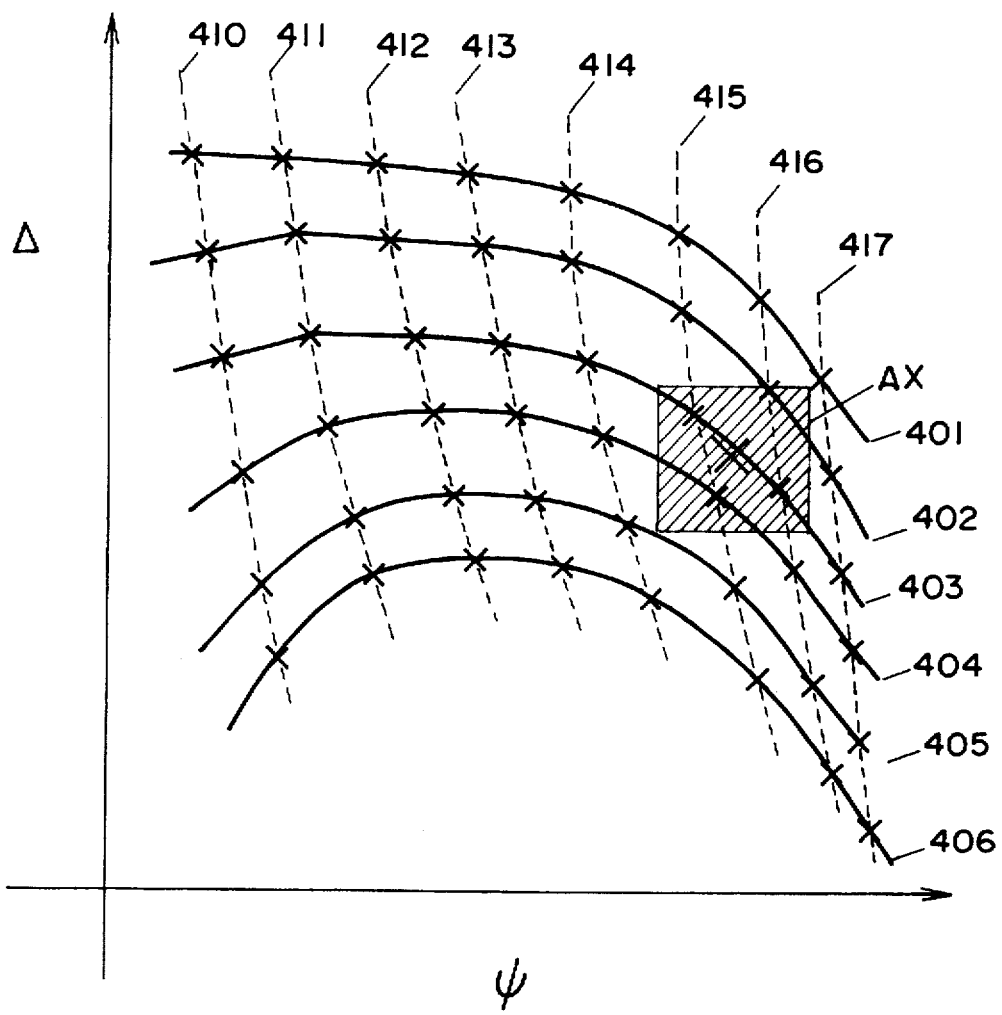
FIG. 9 is a graph of $\Delta$-$\phi$ map.

Next, referring to FIGS. 9 and 10, the flow of the exposure condition optimizing process will be explained. FIG. 9 corresponds to a case where chips of a number 8×6 are printed on one wafer, and it illustrates the results of polarization analysis as a $\Delta$-$\phi$ map. At measurement points on a curve 410, for example, the exposure amount is constant while the focus changes. At measurement points on a curve 401, on the other hand, the focus is constant whereas the exposure amount changes.

The shot region depicted by a rectangular frame AX in the $\Delta$-$\phi$ map shows the range of optimum duty in association with the SEM measurement as described hereinbefore. Thus, when an exposure shot is measured in accordance with the polarization analysis method and, if $\Delta$ and $\phi$ are within the range of this frame AX, it is confirmed that the duty is optimum.

Figure 10:
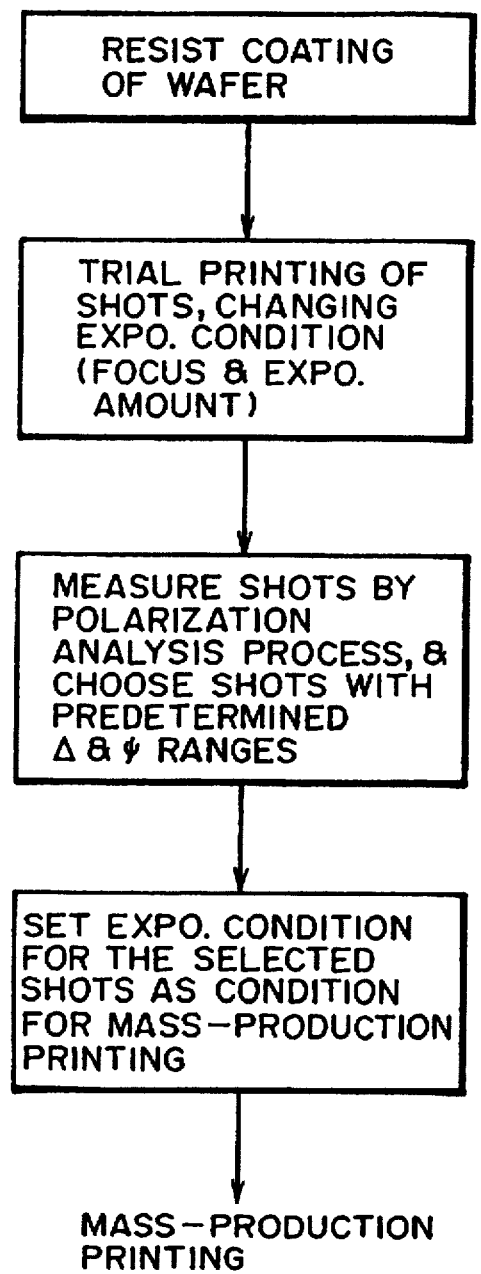
FIG. 10 is a flow chart for explaining a case where a polarization analysis process is applied to exposure condition setting.
Figure 11A:
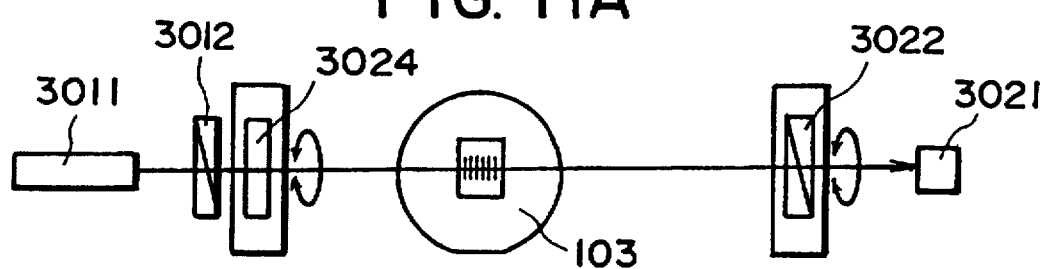
FIGS. 11A through 11D are schematic views for explaining an arrangement for polarization analysis.
Figure 11B:
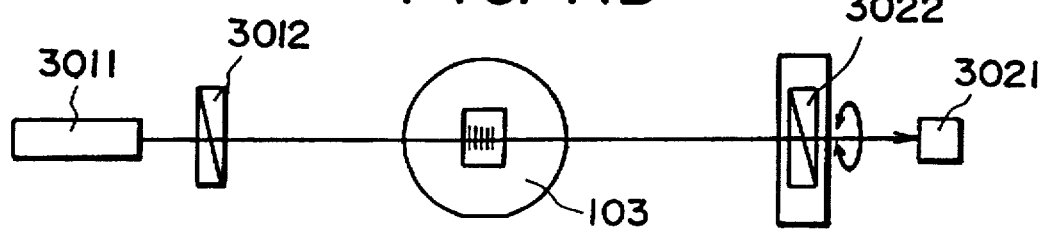
Figure 11C:
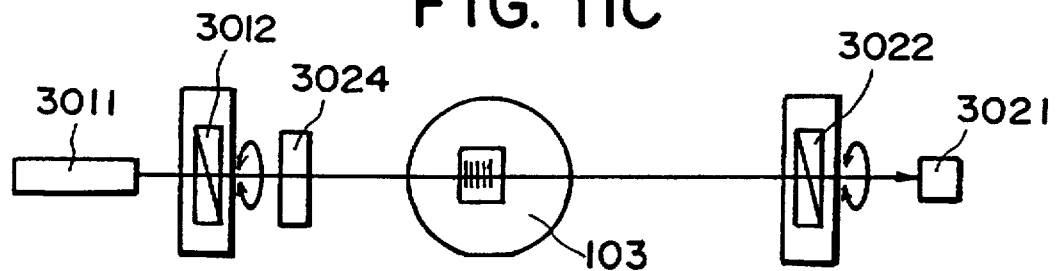
Figure 11D:
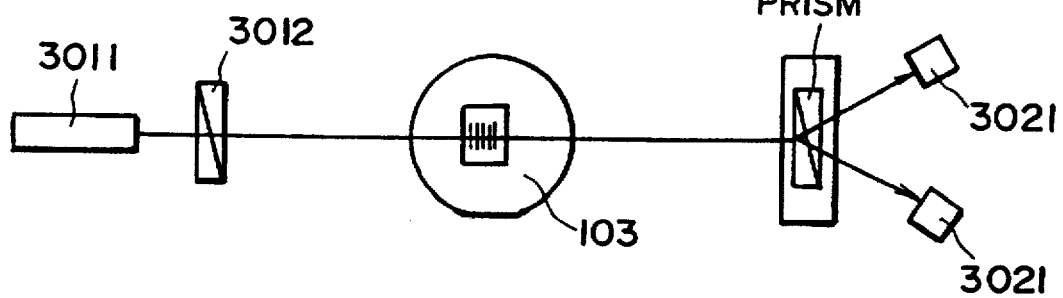

FIG. 10 illustrates the flow of the operation described above. First, a wafer is coated with a resist material. If the thickness of the resist is not predetected, it is measured at this stage. Subsequently, a trial printing process is performed while moving the stage stepwise and while changing the focus and exposure amount (shutter time), as described hereinbefore.

Then, without unloading the wafer from the wafer chuck, the stage is moved in a similar way and measurement of $\Delta$ and $\phi$ through the polarization analysis method is performed to different shot regions successively. If the result of polarization analysis is within the predetermined range AX for $\Delta$ and $\phi$, shown in FIG. 9, the exposure condition under which that shot region has been exposed is taken as an optimum exposure condition for mass-production printing.

The duty check according to the polarization analysis process described above may be performed at a desired stage or stages in the wafer mass-production printing process, which is effective to increase the yield.

In the present embodiment, the optimum exposure condition is set in the manner described above and, thereafter, the wafer is treated by a development process, whereby devices of high integration are produced.

Figure 12:
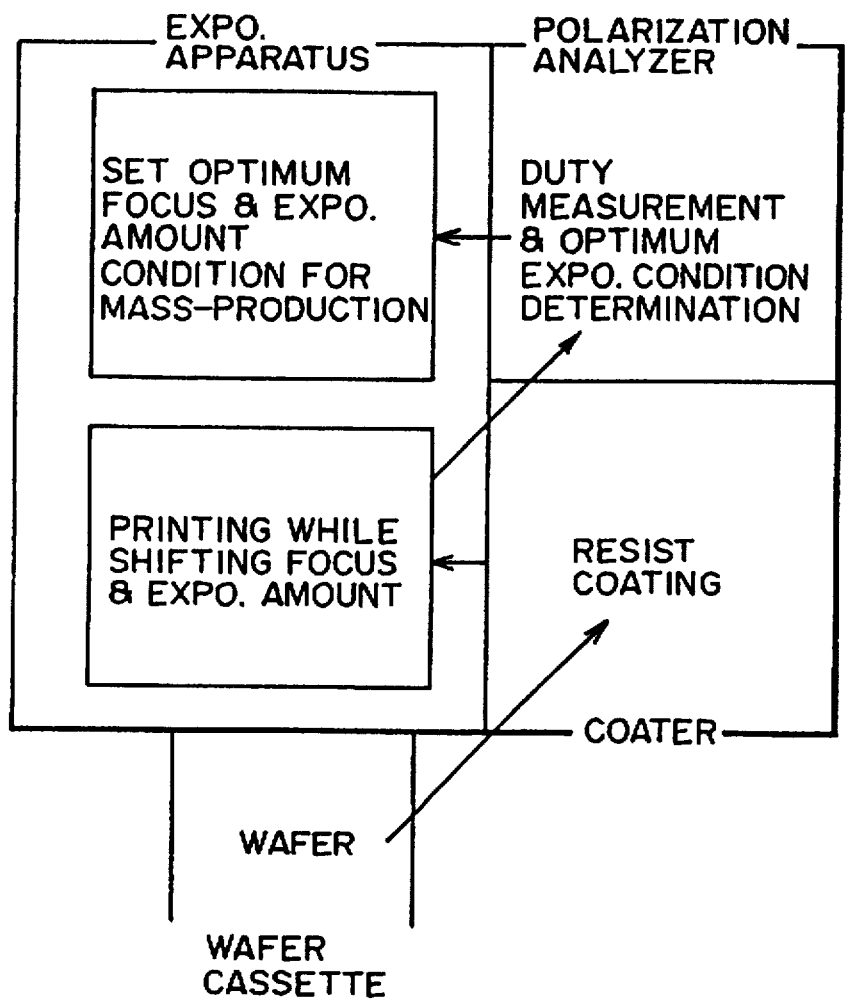
FIG. 12 is a schematic view for explaining a second embodiment of the present invention wherein a polarization analyzing device is provided separately.

FIG. 12 illustrates a second embodiment of the present invention. In this embodiment, as compared with the first embodiment, a polarization analyzing system is provided separately from the wafer stage of an exposure apparatus, on an occasion when there is some physical limitation in the structure of the exposure apparatus, for example. The remaining portion of this embodiment is essentially of the same structure as that of the first embodiment.

Figure 13:
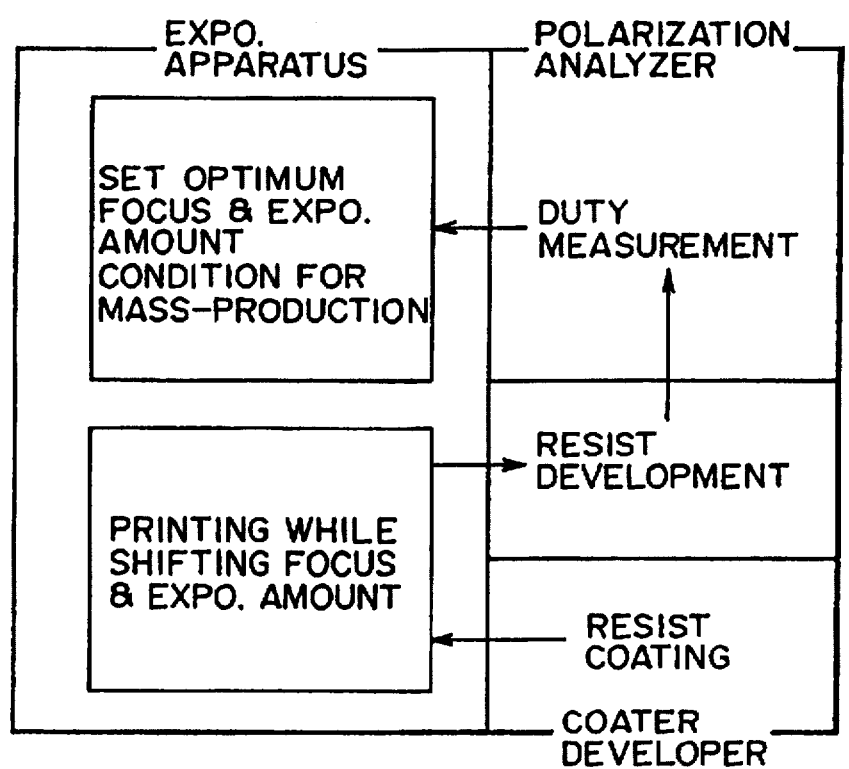
FIG. 13 is a schematic view for explaining a third embodiment of the present invention wherein a resist development process is added.
Figure 14:
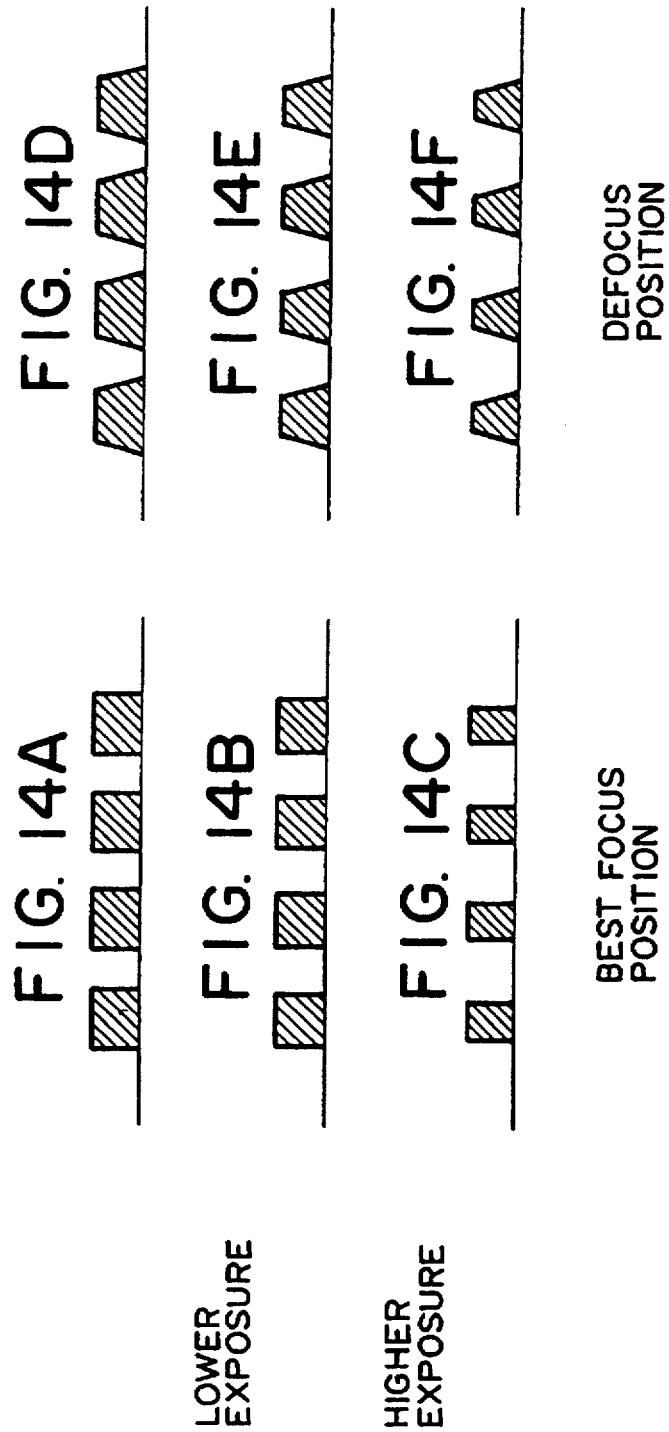
FIGS. 14A through 14F are schematic views for explaining sectional configurations as defined by a development process.

FIG. 13 illustrates a third embodiment of the present invention. As compared with the first embodiment wherein polarization analysis is performed to latent images without developing a resist on a wafer, in this embodiment, the polarization analysis is performed after a development process is executed to a resist. The remaining portion of this embodiment is of substantially the same structure as that of the first embodiment.

FIGS. 14(a) through 14(F) are schematic views of sectional shapes of print patterns after the resist development process, in this embodiment. It is seen from these FIGS. 14 that, in this embodiment, as compared with the latent image analysis method of the first and second embodiments, because the refractivity n2 is that of a gas having a refractivity of about 1.0, there is a large refractivity difference between the line and the space. It is advantageous in the point of duty measurement precision. Thus, this method is effective when there is a strict condition.

In this embodiment, polarization analysis is performed to a print pattern after being treated by a development process and the optimum exposure condition is determined. This enables determination of an optimum exposure condition in a shorter time, as compared with a case where SEM is used.

Figure 15:
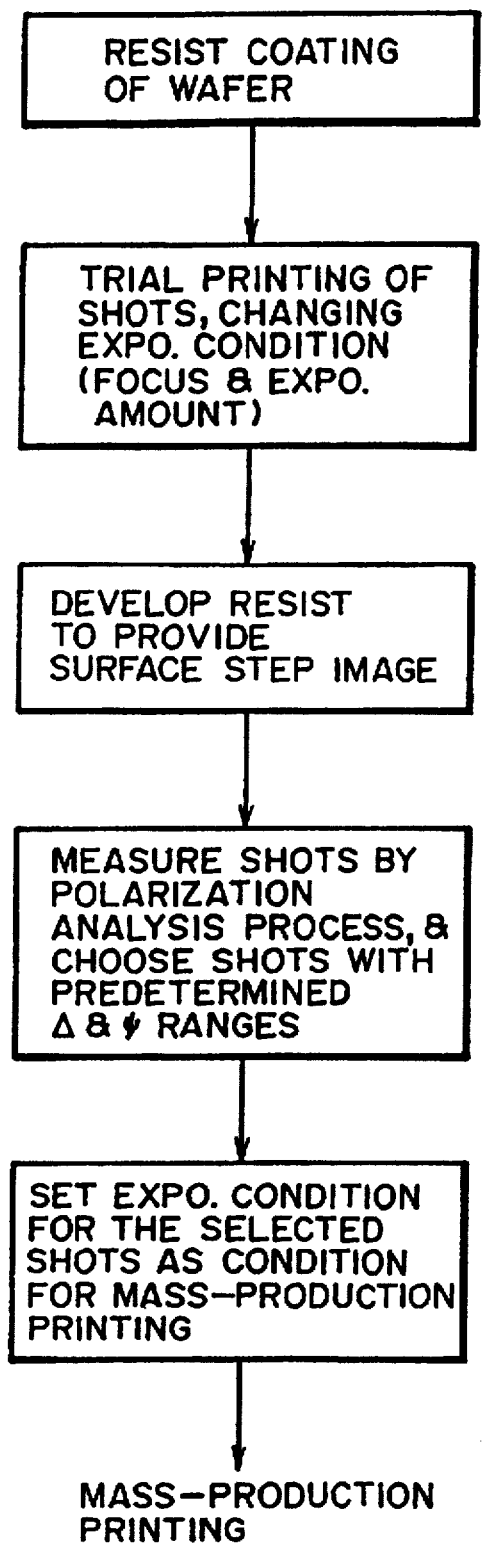
FIG. 15 is a flow chart for explaining a case where a development process is added.

FIG. 15 is a flow chart according to this embodiment.

Figure 16:
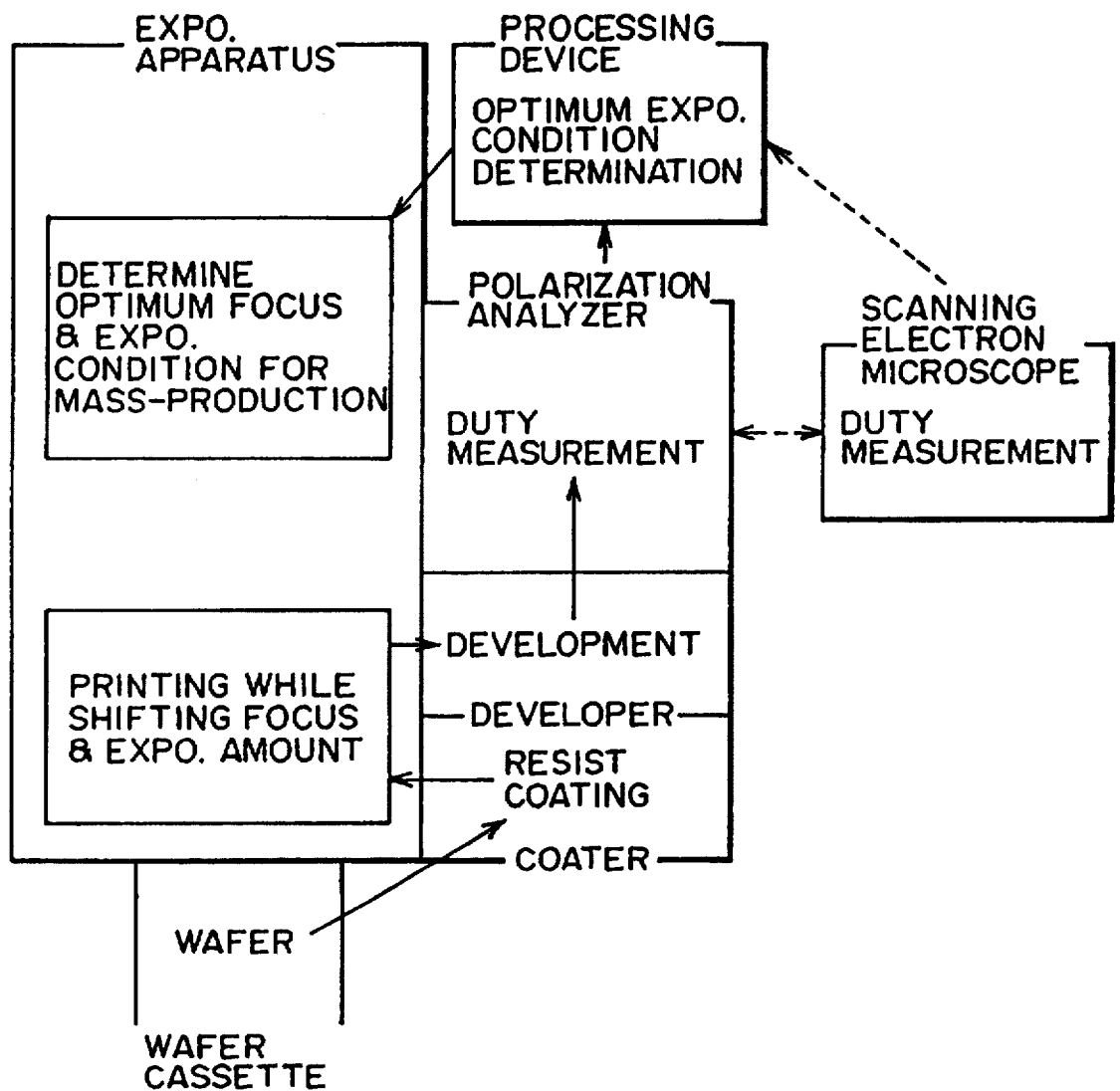
FIG. 16 is a schematic view for explaining a fourth embodiment of the present invention wherein a scanning electron microscope is juxtaposed.

FIG. 16 is a schematic view of a fourth embodiment of the present invention. This embodiment differs from the first embodiment in that a resist development process and an SEM process are juxtaposed. The remaining portion of this embodiment is of substantially the same structure as that of the first embodiment. It is to be noted that in this embodiment the SEM is used for calibration of duty measurement based on the polarization analysis process, to check a developed resist image as required.

Figure 17:
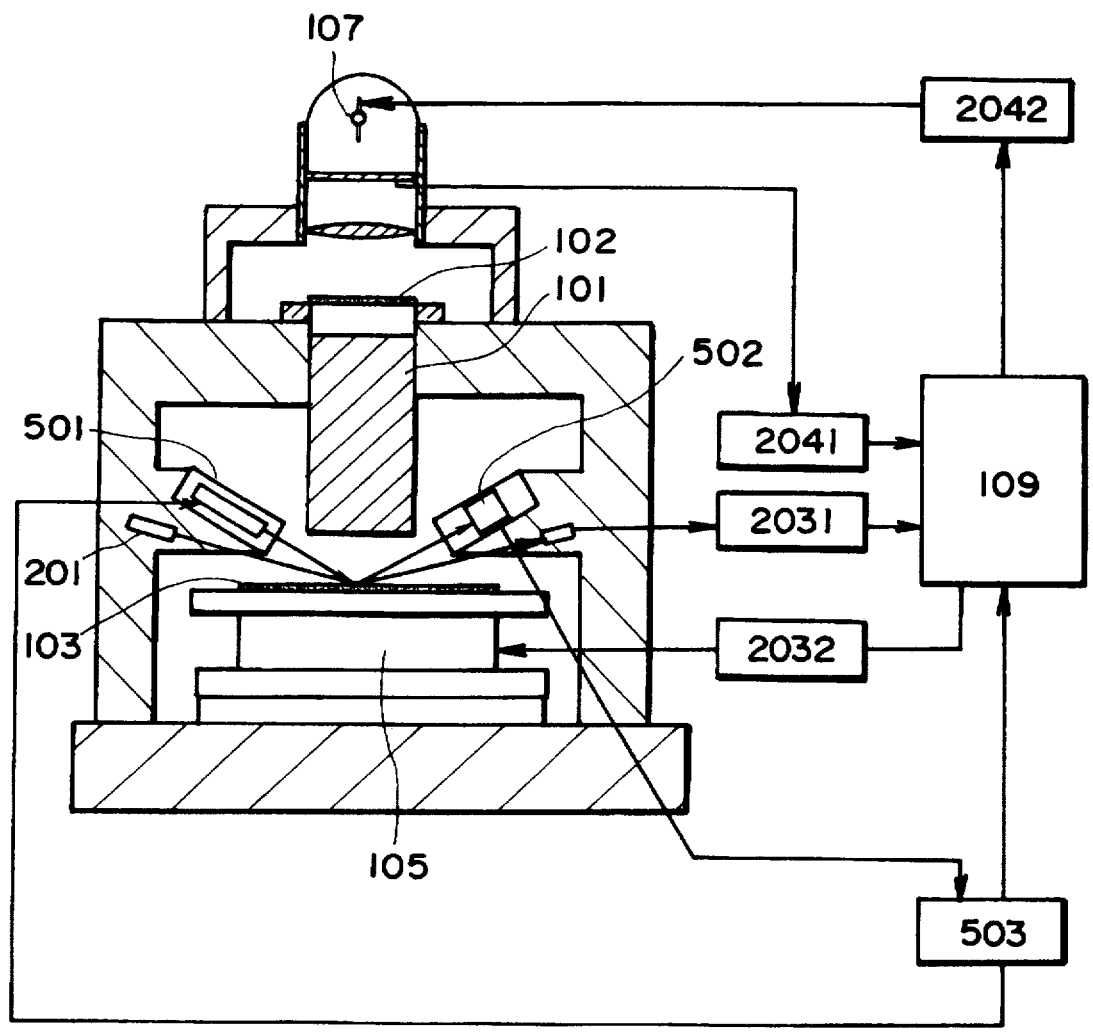
FIG. 17 is a schematic and sectional view of a main portion of a projection exposure apparatus according to a fifth embodiment of the present invention.

Referring now to FIG. 17, a fifth embodiment of the present invention will be explained. In FIG. 17, those elements denoted at reference numerals other than 501–503 correspond to the elements in the first embodiment denoted by similar reference numerals. An important feature of this embodiment resides in a monochrometer 501 having a white light source (not shown) contained therein. Light from the white light source is wave-dispersed by means of a diffraction grating, for example, and then a portion thereof is extracted by using a slit. This provides shortening of the wavelength, to an order which causes interference at the top and bottom surfaces of a resist film on a wafer. Denoted at 502 is a photoelectric detector for detecting the quantity of reflection interference light from the top and bottom surfaces of a resist pattern (developed image or latent image). Denoted at 503 is a driver and processing means for driving the wavelength of the monochrometer 501, for calculating the refractivity of the resist pattern on the basis of an electrical signal from the photoelectric detector 502, and for transmitting the result of calculation to a central processing unit 109. It is to be noted here that the element 501 may be replaced by a white light source and that the element 502 may be replaced by a spectrometer for detecting a spectral reflectivity.

The principle of measurement will be explained below. It is to be noted that the film thickness of the resist is predetected, by measurement using a separate film thickness measuring device, for example. Also, the processes of measurement of the refractivity of the resist pattern, calculation of the duty of the pattern and control of the focus and exposure amount are essentially the same as those of the first embodiment. Thus, description of them are omitted here.

The principle of measurement will be described with reference to FIGS. 18A–18C, and the structure and operation will be explained with reference to FIGS. 19–21D.

First, referring to FIGS. 18A–18D, the basic principle of measurement for calculating the refractivity will be explained. It is now assumed that the refractivities of the mediums, in an order from the light incidence side, are n1, n2 and n3, respectively, and that the film thickness is d. Also, it is assumed that the incidence angles of a wavelength (wavelength used in a vacuum is $\lambda_0$) are $\theta_1$, $\theta_2$ and $\theta_3$, respectively. The amplitude reflectivity Y in this case is given by the following equation ("Principles of Optics" 3rd Edition by M. Born and E. Wolf, PREGAMON PRESS, page 62):

$$Y=(Y_{12}+Y_{23}e^{2i\beta})/(1+Y_{12}Y_{23}e^{2i\beta}) \qquad (1)$$

wherein $Y_{12}$ is a Fresnel reflection coefficient at the boundary between the medium 1 and the medium 2, $Y_{23}$ is a Fresnel reflection coefficient at the boundary between the medium 2 and the medium 3, and $\beta$ is $\beta=(2\pi/\lambda_0)n_2 d \cos\theta_2$. The amount which can be measured practically is the reflection intensity, that is, $R=|Y|^2$ (usually called "reflectivity"), and it is expressed as follows:

$$R=(y_{12}^2+Y_{23}^2+2Y_{12}Y_{23}\cos 2\beta)/(1+Y_{12}^2Y_{23}^2+2Y_{23}\cos 2\beta) \qquad (2)$$

From equation (2), the refractivity $n_2$ to be measured is given by:

$$n_2=(\lambda_0/4\pi d \cos\theta_2)\{2\pi N+\cos^{-1}[(R+RY_{12}^2Y_{23}^2-Y_{12}^2-Y_{23}^2)/(2Y_{12}Y_{23}(1-R))]\} \qquad (3)$$

wherein N is an integer.

The reflectivity R and refractivity $n_2$ as the wavelength $\lambda_0$ used changes are such as illustrated in FIGS. 18B and 18C. Thus, by taking an average $n_{2AV}$ of the refractivities $n_2$ at different wavelengths as the refractivity, high precision measurement of good reproducibility is assured.

For higher precision measurement of the refractivity, it is important to increase the precision of reflectivity measurement. The present embodiment improves the measurement precision for the reflectivity.

The measurement precision may be degraded by the following factors:

(1) stray light;

(2) changes in a light quantity detector; and (3) changes with time.

In accordance with the present embodiment, these factors are corrected automatically, whereby enhancement of measurement precision is attained.

Figure 19:
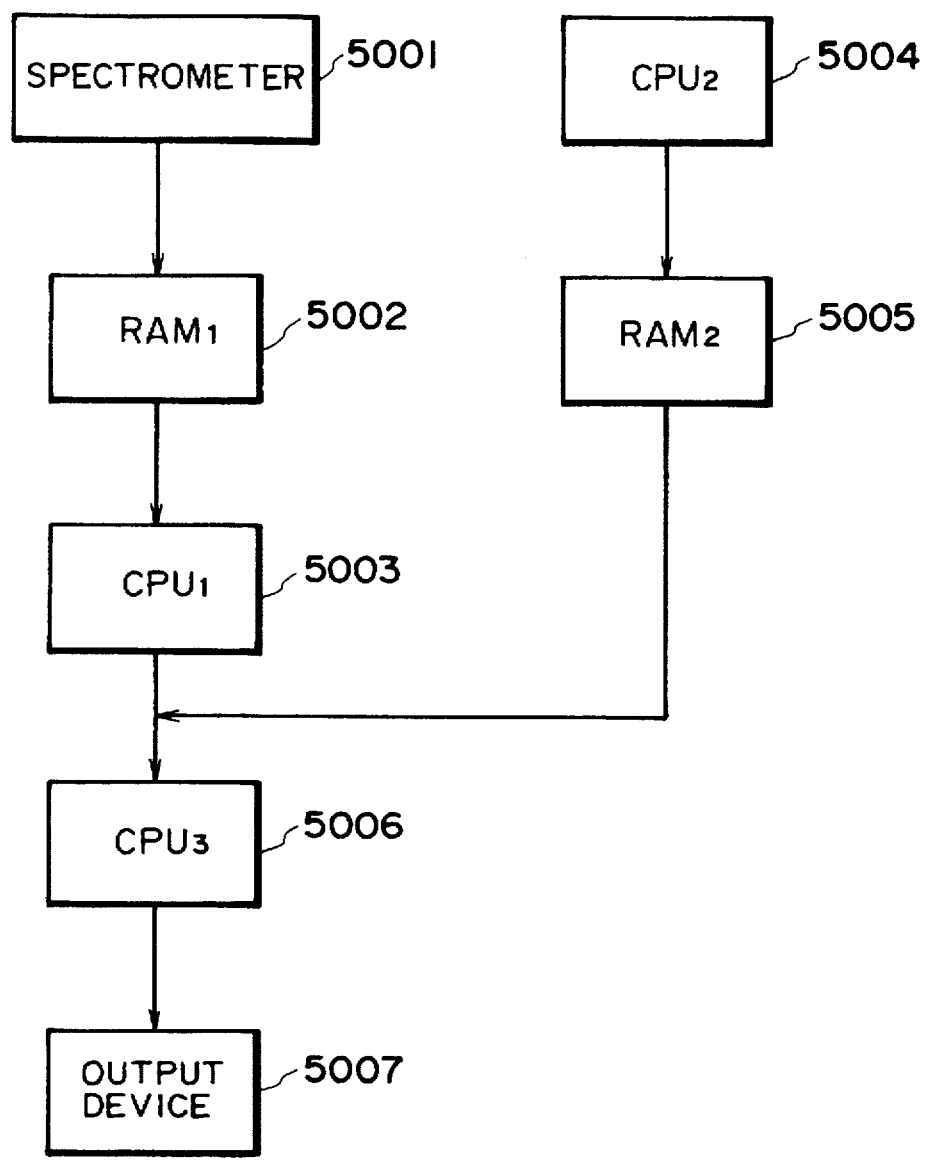
FIG. 19 is a block diagram for explaining the structure according to an embodiment of the present invention.
Figure 20:
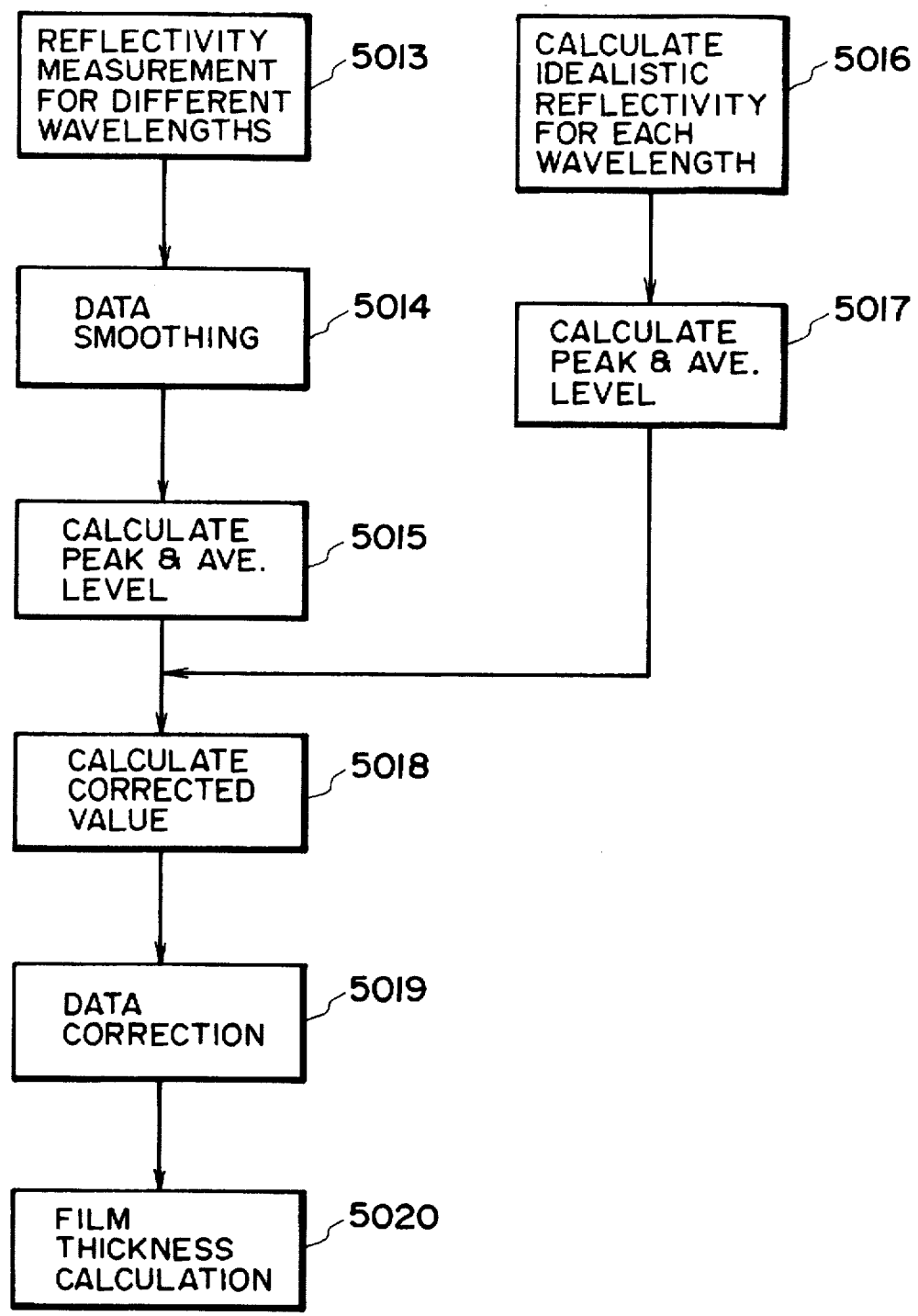
FIG. 20 is a flow chart for explaining a processing operation in an embodiment of the present invention.
Figure 21A:
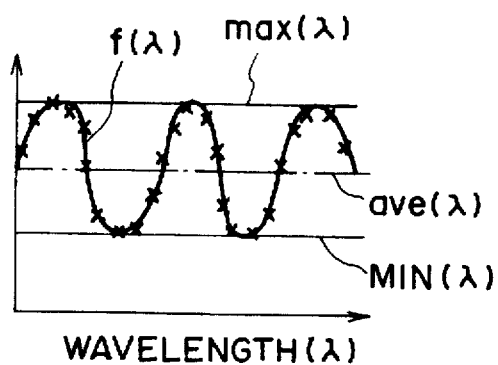
FIGS. 21A–21D are graphs, respectively, for explaining signal states in a embodiment of the present invention.
Figure 21B:
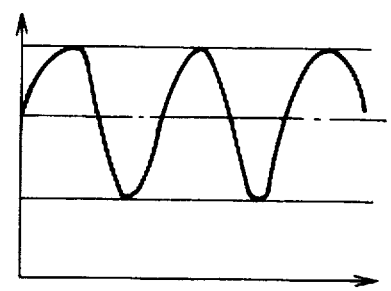
Figure 21C:
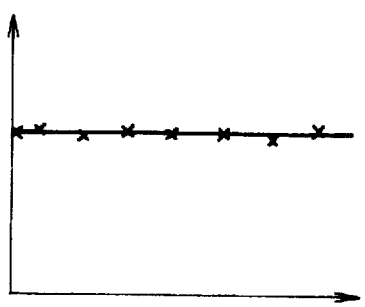
Figure 21D:
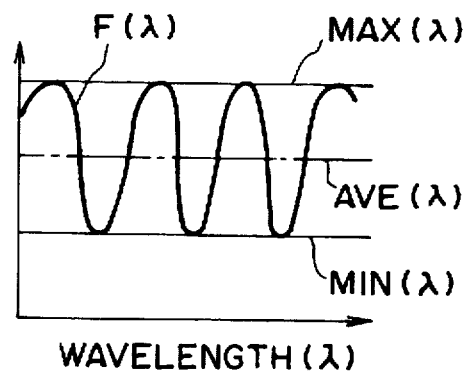

FIGS. 19, 20 and 21A–21D are illustrations for explaining the principle of measurement and, more specifically, FIG. 19 shows the structure, FIG. 20 shows the procedure, and FIGS. 21A–21D show signals at respective processes in the flow of FIG. 20.

In FIG. 19, showing the structure of the present embodiment, denoted at 5001 is a spectrometer, and denoted at 5002 is a first random access memory (RAM1) for memorizing output signals from the spectrometer 5001 corresponding to the reflectivities at respective wavelengths. Denoted at 5003 is a first central processing unit (CPU1) for performing computing operations to those output signals, and denoted at 5004 is a second central processing unit (CPU2) for calculating a predetermined idealistic reflectivity of film and for performing data processing to a value calculated. Denoted at 5005 is a second random access memory (RAM2) for memorizing the data processed by the CPU2 5004, and denoted at 5006 is a third central processing unit (CPU3) for correcting the data from the RAM1 5002 on the basis of the processed data from RAM2 5005 and also for calculating the film thickness. Denoted at 5007 is an output device for outputting the result of the film thickness calculation.

The operation of this embodiment will now be explained with reference to FIGS. 20 and 21A–21D.

First, data of reflectivity measurement (Step 5013 of FIG. 20) at respective wavelengths from the spectrometer, namely, the data of RAM1 5002, is smoothed in accordance with high-speed Fourier transformation, for example, by CPU1 5003 (Step 5014 in FIG. 20). That is, points denoted by crosses in FIG. 21D correspond to measured values, and a solid line $f(\lambda)$ corresponds to the result of smoothing. Here, f is the function of the wavelength $\lambda$.

Subsequently, a maximum level, a minimum level and an intermediate level of them are determined (Step 5015 in FIG. 20). To this end, maximum points are connected to provide a curve $max(\lambda)$, and minimum points are connected to provide a curve $min(\lambda)$. Then, an intermediate level $ave(\lambda)$ is determined in accordance with an equation:

$$ave(\lambda)=\{max(\lambda)+min(\lambda)\}/2.$$

On the other hand, a theoretical value of the reflectivity of the film to be examined, namely, idealistic reflectivities at respective wavelengths, is calculated by means of the CPU2 5005 (Step 5016 in FIG. 20) and, from a resultant curve $F(\lambda)$, a curve $MAX(\lambda)$ connecting the maximum points and a curve $MIN(\lambda)$ connecting the minimum points as well as an intermediate level $AVE(\lambda)$ are determined by calculation (Step 5017 in FIG. 20). The data of $MAX(\lambda)$, $MIN(\lambda)$ and $AVE(\lambda)$ are stored into the RAM2 5005.

From the data described above, the CPU3 5006 operates to correct $f(\lambda)$, and $f'(\lambda)$ is provided as follows:

$$f'(\lambda)=\{f(\lambda)-ave(\lambda)\}\times\{[MAX(\lambda)-MIN(\lambda)]/[max(\lambda)-min(\lambda)]\}+AVE(\lambda) \qquad (4)$$

A gain change in the reflectivity data caused by any of the aforementioned factors for measurement precision deterioration, is corrected in accordance with the first term of equation (4), and a bias change is corrected in accordance with the second term (Step 5018 and Step 5019 in FIG. 20).

Further, $f'(\lambda)$ having been corrected as described is taken as R, and the refractivity $n_2$ is calculated in accordance with equation (3) described hereinbefore (Step 5020 in FIG. 20). As a result, the film thickness is measured very precisely.

On an occasion when similar samples are to be measured repeatedly, it is merely a consumption of time to calculate $max(\lambda)$, $min(\lambda)$ and $ave(\lambda)$ for every measurement operation. Thus, the data of the sample obtained in the first-time measurement may be used, and correction may be made on the basis of this data. The N-th sample measurement $f'_N(\lambda)$ may be calculated in accordance with the following equation:

$$f'_N(\lambda)=\{f_N(\lambda)-ave_1(\lambda)\}\times\{[MAV_1(\lambda)-MIN_1(\lambda)]/[max_1(\lambda)-min_1(\lambda)]\}+AVE_1(\lambda)$$

wherein suffix 1 and suffix N mean that the value is the result at the first measurement operation or at the N-th measurement operation.

It is not necessary that the first sample be completely the same as the N-th sample. Namely, it is sufficient that gain and bias are applied to $f_N(\lambda)$. There is substantially no disadvantage provided that it is within the range in which the factors for measurement precision degradation are unchanged.

While the invention has been described with reference to the structures disclosed herein, it is not confined to the details set forth and this application is intended to cover such modifications or changes as may come within the purposes of the improvements or the scope of the following claims.

What is claimed is:

1. A state-of-formation detecting system for detecting a state of formation of a periodic pattern, said system comprising:

light projecting means for projecting input light, having a predetermined state of polarization, onto the periodic pattern; and determining means for receiving signal light from the periodic pattern and for detecting a change in the state of polarization of the input light, to determine the state of formation of the periodic pattern on the basis of the change in the state of polarization.

2. A system according to claim 1, wherein the state of formation of the periodic pattern to be detected concerns a duty of the periodic pattern.

3. A system according to claim 1, wherein the input light has a wavelength different from that of the exposure light.

4. A projection exposure apparatus for projecting a periodic pattern of a first object, illuminated with exposure light, onto a second object having a photosensitive material applied thereto, through a projection optical system, said apparatus comprising:

light projecting means for projecting input light having a predetermined state of polarization, onto a print pattern formed on the photosensitive material; and determining means for receiving signal light from the print pattern and for detecting a change in the state of polarization of the input light, to determine the state of formation of the periodic pattern on the basis of the change in the state of polarization.

5. An apparatus according to claim 4, wherein the state of formation of the print pattern to be detected concerns a duty of the print pattern.

6. An apparatus according to claim 4, wherein the input light has a wavelength different from that of the exposure light.

7. A projection exposure method for projecting a periodic pattern of a first object, illuminated with exposure light, onto a second object having a photosensitive material applied thereto, through a projection optical system, said method comprising:

a pattern projecting step for projecting the periodic pattern of the first object onto the photosensitive material of the second object while changing an exposure condition, to form plural print patterns on the second object;

a first determining step for projecting input light having a predetermined state of polarization onto a print pattern formed on the photosensitive material, for receiving signal light from the print pattern, and for detecting a change in the state of polarization of the input light, to determine a state of formation of the print patterns on the basis of the change in the state of polarization; and a second determining step for determining the exposure condition on the basis of the state of formation of the print patterns.

8. A method according to claim 7, wherein the exposure condition concerns an amount of exposure of the second object.

9. A method according to claim 7, wherein the exposure condition concerns a position of the second object with respect to a direction along an optical axis of the projection optical system.

10. A method according to claim 7, wherein the state of formation of the print pattern to be detected concerns a duty of the print pattern.

11. A method according to claim 7, wherein the input light has a wavelength different from that of the exposure light.

12. A device manufacturing method wherein a pattern of a reticle is projected onto a wafer through a projection optical system and wherein the wafer is subsequently treated by a development process, whereby a device is produced, said method comprising:

a pattern projecting step for projecting a periodic pattern of the reticle onto a photosensitive material of the wafer while changing an exposure condition, to form plural print patterns on the wafer;

a first determining step for projecting input light having a predetermined state of polarization onto a print pattern formed on the photosensitive material, for receiving signal light from the print pattern and for detecting a change in the state of polarization of the input light, to determine a state of formation of the print patterns on the basis of the change in the state of polarization; and a second determining step for determining the exposure condition on the basis of the state of formation of the print patterns.

13. A state-of-formation detecting system for detecting a state of formation of a periodic pattern, said system comprising:

light projecting means for projecting input light having different wavelengths onto the periodic pattern; and determining means for receiving signal light from the periodic pattern and for detecting reflectivity in relation to each of the different wavelengths of the input light, to determine the state of formation of the periodic pattern on the basis of the reflectivities related to the different wavelengths.

14. A system according to claim 13, wherein the state of formation of the periodic pattern to be detected concerns a duty of the periodic pattern.

15. A system according to claim 13, wherein the input light has a wavelength different from that of the exposure light.

16. A projection exposure apparatus for projecting a periodic pattern of a first object, illuminated with exposure light, onto a second object having a photosensitive material applied thereto, through a projection optical system, said apparatus comprising:

light projecting means for projecting input light having different wavelengths onto a print pattern formed on the photosensitive material; and determining means for receiving signal light from the print pattern and for detecting reflectivity in relation to each of the different wavelengths of the input light, to determine the state of formation of the periodic pattern on the basis of the reflectivities related to the different wavelengths.

17. A system according to claim 16, wherein the state of formation of the periodic pattern to be detected concerns a duty of the periodic pattern.

18. A system according to claim 16, wherein the input light has a wavelength different from that of the exposure light.

19. A projection exposure method for projecting a periodic pattern of a first object, illuminated with exposure light, onto a second object having a photosensitive material applied thereto, through a projection optical system, said method comprising:

a pattern projecting step for projecting the periodic pattern of the first object onto the photosensitive material of the second object while changing an exposure condition to form plural print patterns on the photosensitive material;

a first determining step for projecting input light having different wavelengths onto a print pattern, for receiving signal light form the print pattern, and for detecting reflectivity in relation to each of the different wavelengths of the input light, to determine the state of formation of the print pattern on the basis of the reflectivities related to the different wavelengths; and a second determining step for determining the exposure condition on the basis of the state of formation of the print patterns.

20. A method according to claim 19, wherein the state of formation of the periodic pattern to be detected concerns a duty of the periodic pattern.

21. A method according to claim 19, wherein the input light has a wavelength different from that of the exposure light.

22. A method according to claim 19, wherein the exposure condition concerns an amount of exposure of the second object.

23. A method according to claim 19, wherein the exposure condition concerns a position of the second object with respect to a direction along an optical axis of the projection optical system.

24. A device manufacturing method wherein a pattern of a reticle is projected onto a wafer through a projection optical system and wherein the wafer is subsequently treated by a development process whereby a device is produced, said method comprising:

a pattern projecting step for projecting a periodic pattern of the reticle onto a photosensitive material of the wafer while changing an exposure condition, to form plural print patterns on the wafer;

a first determining step for projecting input light having different wavelengths onto a print pattern formed on the photosensitive material, for receiving signal light from the print pattern, and for detecting reflectivity in relation to each of the different wavelengths of the input light, to determine the state of formation of the print pattern on the basis of the reflectivities related to the different wavelengths; and a second determining step for determining the exposure condition on the basis of the state of formation of the print patterns.

* * * * *

UNITED STATES PATENT AND TRADEMARK OFFICE
CERTIFICATE OF CORRECTION

PATENT NO. : 5,777,744

DATED : July 7, 1998

INVENTORS : MINORU YOSHII, ET AL.

It is certified that error appears in the above-identified patent and that said Letters Patent is hereby corrected as shown below:

COLUMN 3:

line 55, "the the" should read --the--.

COLUMN 4:

line 40, "a" should read --an--.

COLUMN 8:

line 26, "the the" should read --the--;
    line 34, "measure" should read --measured--; and
    line 47, "$t\perp=(t\perp+t\|)/2$" should read --$tI=(t\perp+t\|)/2$--.

COLUMN 9:

line 1, "$t2=(t1+t2)/2$" should read --$t=(t1+t2)/2.$--.

UNITED STATES PATENT AND TRADEMARK OFFICE
CERTIFICATE OF CORRECTION

PATENT NO. : 5,777,744

DATED : July 7, 1998

INVENTORS : MINORU YOSHII, ET AL.

It is certified that error appears in the above-identified patent and that said Letters Patent is hereby corrected as shown below:

COLUMN 10:

line 6, "14(a)" should read --14(A)--; and
    line 8, "14" should be deleted.

COLUMN 11:

line 5, "(wavelength used" should read --used (wavelength--; and
    line 20, "$(I+Y_{12}^2 Y_{23}^2 + 2Y_{23}\cos 2\beta)$" should read --$(I+Y_{12}^2 Y_{23}^2 + 2Y_{12}Y_{23} \cos 2\beta)$--.

COLUMN 13:

line 22, "light" (second occurrence) should read --light,--.

COLUMN 14:

line 13, "pattern" should read --pattern,--.

UNITED STATES PATENT AND TRADEMARK OFFICE
CERTIFICATE OF CORRECTION

PATENT NO. : 5,777,744

DATED : July 7, 1998

INVENTORS : MINORU YOSHII, ET AL.

It is certified that error appears in the above-identified patent and that said Letters Patent is hereby corrected as shown below:

<u>COLUMN 15</u>:

```
line 3, "form" should read --from--.
```

Signed and Sealed this

Sixteenth Day of March, 1999

Attest:

Attesting Officer

Q. TODD DICKINSON

Acting Commissioner of Patents and Trademarks